United States Patent [19]

Sugawara

[11] Patent Number: 5,650,854
[45] Date of Patent: Jul. 22, 1997

[54] METHOD OF CHECKING DEFECTS IN PATTERNS FORMED ON PHOTO MASKS

[75] Inventor: Minoru Sugawara, Kanagawa, Japan

[73] Assignee: Sony Corporation, Tokyo, Japan

[21] Appl. No.: 655,894

[22] Filed: May 31, 1996

[30] Foreign Application Priority Data

Jun. 2, 1995 [JP] Japan ................................. 7-160102

[51] Int. Cl.$^6$ .................................................. G01B 11/00
[52] U.S. Cl. ........................ 356/394; 356/237; 356/239
[58] Field of Search ............................ 356/394, 398, 356/237, 239, 399–400

[56] References Cited

U.S. PATENT DOCUMENTS

| | | | |
|---|---|---|---|
| 4,218,142 | 8/1980 | Kryger et al. | 356/394 |
| 4,247,203 | 1/1981 | Levy et al. | 356/398 |
| 4,926,489 | 5/1990 | Danielson et al. | 356/399 |

*Primary Examiner*—Frank Gonzalez
*Assistant Examiner*—Amanda Merlino
*Attorney, Agent, or Firm*—Hill, Steadman & Simpson

[57] ABSTRACT

Disclosed is a patten defect checking method which is affected neither by the presence of a correction pattern or an auxiliary pattern nor by the waveguide effect and which makes it always possible to reliably detect any defect in a pattern formed on a photo mask regardless of the type of photo mask. In the method for checking defects in a pattern formed on a photo mask, the light intensity distribution due to the light transmitted through the photo mask is compared with a light intensity distribution calculated on the basis of pattern data, whereby any defect in the pattern formed on the photo mask is detected.

4 Claims, 2 Drawing Sheets

METHOD OF CHECKING DEFECTS IN PATTERNS FORMED ON PHOTO MASKS

BACKGROUND OF THE INVENTION

1. Field of the Invention

The present invention relates to a method of checking defects in photo masks used, for example, in various types of pattern formation techniques, etc. in the production of semiconductor devices.

2. Description of the Related Art

A photo mask, which is used in the pattern transfer process, i.e., the so-called lithography process, in the production of semiconductor devices, is used for the purpose of transferring a pattern formed thereon to a resist material formed on a wafer. It is usually impossible to completely eliminate defects in the pattern formed on the photo mask, so that pattern defect checking is performed mainly by a method which is described below. In the following description, the term "pattern" means a pattern formed on a photo mask unless it is defined otherwise.

First, the photo mask is irradiated with rays of light, and those rays of light transmitted through the pattern are detected by a photo detector such as a CCD sensor or a photo multiplier, the pattern being reproduced as a light intensity distribution. If there is any defect in the pattern, the light intensity distribution reproduced as the pattern indicates various changes depending upon the size or type of the defect. These changes in the light intensity distribution are recognized as a defect by the following two defect checking methods:

The first defect checking method (which is called a "die-to-die method") is applied to a case in which a plurality of patterns of the same configuration exist on a photo mask. In this first defect checking method, the light intensity distribution which has changed due to the pattern defects is compared with a light intensity distribution formed by a pattern of the same configuration having no defect and arranged in a different section of the photo mask. Any defect in the pattern is recognized as such by the difference between these light intensity distributions.

In the second defect checking method (which is called a "die-to-data-base method"), the light intensity distribution which has varied due to a pattern defect is, as shown in the pattern defect checking flowchart of FIG. 1, compared with pattern data, and any defect in the pattern is recognized as such by the difference between the light intensity distribution and the pattern data. Here, the pattern data is first used to form a pattern on a photo mask by an electron beam, a laser beam or the like. In the defect checking, this pattern data is used for comparison with the light intensity distribution.

The conventional checking methods have the following problems:

As a result of the recent increase in the chip size of semiconductor devices, it is becoming impossible to arrange a plurality of patterns of the same configuration on a photo mask, which means it is only possible to form a single pattern on a photo mask. Thus, it is becoming practically impossible to adopt the first defect checking method. As a result, there is nothing for it but to adopt the second defect checking method. However, this second defect checking method has the following problems:

First, nowadays, the pattern size is approaching the wavelength of the exposure light of an exposure device such as a stepper. As the pattern size is thus reduced, it becomes impossible for the configuration of the pattern formed on the photo mask to be faithfully transferred to the resist formed on the wafer due to a physical phenomenon called light proximity effect. In view of this, a correction process which is generally called a light proximity effect correction is effected on the pattern in order to achieve an improvement in the faithfulness with which the pattern formed on the photo mask is transferred to the resist formed on the wafer.

This light proximity effect correction can be effected in various ways. Usually, the following methods are adopted: a method in which a minute pattern is added to the pattern; a method in which a minute pattern is deleted from the pattern; a method in which a minute pattern is added to the vicinity of the pattern; and a method in which the pattern size is locally increased or decreased. This light proximity effect correction is performed for the purpose of transferring a desired pattern configuration as faithfully as possible to the resist formed on the wafer by correcting the pattern. Generally speaking, the correction is conducted in many cases with a minute pattern which is of a size smaller than the wavelength of the exposure light. In a light intensity distribution obtained from a pattern corrected through light proximity effect correction, the minute correction pattern and the local increase or decrease in pattern size are not reproduced faithfully due to light diffraction effect. Thus, a difference corresponding to the correction pattern is inevitably generated between the pattern data, which is faithfully endowed with a minute correction pattern or a local increase or decrease in pattern size, and the light intensity distribution, so that, in the second conventional defect checking method, it is unavoidable that the minute correction pattern or the local increase or decrease in pattern size is erroneously detected as an imaginary defect.

Secondly, nowadays, to improve the resolution in the vicinity of the wavelength limit of the exposure light of an exposure device such as a stepper, use of a phase shift mask is being considered. The phase shift mask is of various types, including a phase alternate arrangement type (Revenson type), an edge enhancement type, an auxiliary pattern type, a half tone type, a chromeless type, etc. When the second conventional defect checking method is used, the detection of transparent defects of different phases is difficult to perform by using any of these types. Generally speaking, the wavelength of the exposure light is in the wavelength range of from near ultraviolet to ultraviolet rays. The wavelength of the light source used for defect checking is usually in the visible light range. Thus, even in the case of a defect indicating a relatively large phase difference in the range of from the near ultraviolet to the ultraviolet rays, the phase difference decreases with the wavelength with which the defect checking is performed, with the result that it is rather difficult for such a defect to be reflected in the pattern due to the light intensity distribution reproduced with the light used in the defect checking.

Further, in a phase shift mask of the auxiliary pattern type, the auxiliary pattern is generally formed in a size smaller than the wavelength of the exposure light for the purpose of reflecting more faithfully the pattern configuration obtained by deleting the auxiliary pattern on the wafer. Thus, a difference corresponding to the auxiliary pattern is inevitably generated between the light intensity distribution obtained from such a pattern and the pattern data, so that, with the second conventional defect checking method, it is unavoidable that an imaginary defect is erroneously detected as a defect even when there is no defect.

In addition, in a phase shift mask in which a phase shift section is formed by engraving a glass substrate, a reflection and interference of light (a physical phenomenon which is generally called waveguide effect) occurs on the side wall of the phase shift section, with the result that a difference is generated between the pattern data and the pattern reproduced as a light intensity distribution, thereby making the defect checking difficult.

Apart from this, use of a phase shift mask of the half tone type, which is effective for an isolated pattern, is being actively considered. In a half tone type phase shift mask, a pattern is formed which is composed of a translucent region which allows transmission of approximately 4% to 20% of light and a light transmitting region. The light transmittance of the translucent region is set in accordance with the wavelength of the exposure light of the stepper or the like. However, in the wavelength of the visible light used for defect checking, the light transmittance of the translucent region increases. As a result, no light intensity distribution is obtained in the defect checking, so that the defect checking itself is often made impossible.

Thirdly, nowadays, to improve the resolution near the wavelength limit of the exposure light of an exposure device such as a stepper, methods are being considered according to which, the configuration of the exposure light source is varied, or a filter is inserted in the pupil plane of the lens. In these methods, the pattern often requires a correction pattern or an auxiliary pattern, so that the same problem as described above is entailed.

It is accordingly an object of the present invention to provide a pattern defect checking method which is affected neither by the presence of a correction pattern or an auxiliary pattern nor by the waveguide effect and which makes it always possible to reliably detect a defect in a pattern formed on a photo mask regardless of the type of photo mask.

SUMMARY OF THE INVENTION

To achieve the above object, the present invention provides a method for checking defects in a pattern formed on a photo mask, wherein the light intensity distribution due to the light transmitted through the photo mask is compared with a light intensity distribution calculated on the basis of pattern data, whereby any defect in the pattern formed on the photo mask can be detected.

The calculation of light intensity distribution on the basis of pattern data can be conducted by a well-known simulation method based on a scalar diffraction theory or a vector diffraction theory, for example, the simulation based on the partial coherency theory as proposed by H. H. Hopkins or the method as disclosed in "Understanding High Numerical Aperture Optical Lithography", Microelectronic Engineering, Vol. 17 (1992), pp. 105–108 by D. G. Flagell, A. E. Rosenblush, C. Progler, and J. Armitage.

In the pattern defect checking method of the present invention, it is desirable that the wavelength of the light transmitted through the photo mask be the same as the wavelength of the exposure light used when transferring the pattern to the wafer.

The photo mask may be of any type. For example, a phase shift mask or a half tone type phase shift mask may be used.

In the second conventional defect checking method described above, any defect in a pattern formed on a photo mask is detected by comparing the light intensity distribution due to the light transmitted through the photo mask with pattern data. In the pattern defect checking method of the present invention, in contrast, any defect in a pattern formed on a photo mask is detected by comparing the light intensity distribution due to the light transmitted through the photo mask with a light intensity distribution calculated on the basis of pattern data. As described above, there is a great difference between pattern data of a pattern which has undergone light proximity effect correction, etc. and a pattern reproduced from a light intensity distribution due to light transmitted through a photo mask. However, there is substantially no great difference between a pattern reproduced from a light intensity distribution calculated on the basis of such pattern data and a pattern reproduced from a light intensity distribution due to light transmitted through a photo mask. Thus, in accordance with the pattern defect checking method of the present invention, it is always possible to reliably detect any defect in a pattern without being affected by the presence of a correction pattern or the presence of an auxiliary pattern or affected by the waveguide effect and, further, regardless of the type of photo mask, so that it is possible to flexibly cope with any pattern or any photo mask structure.

DESCRIPTION OF THE PREFERRED EMBODIMENTS

An embodiment of the present invention will now be described with reference to the drawings.

In forming a transfer pattern configuration, etc. by exposure light on a resist material formed on a wafer, the type of photo mask which is used for reduced projection is in some cases called a "reticle" and the type of photo mask which is used for one-to-one projection is called a "photo mask". In other cases, what corresponds to the original plate is called a "reticle", and what is obtained by copying it is called a "photo mask". In the present specification, what are called by the terms "reticle" and "photo mask", which are thus used in various senses, are generally referred to simply as "photo masks" unless otherwise defined.

Figure 1:
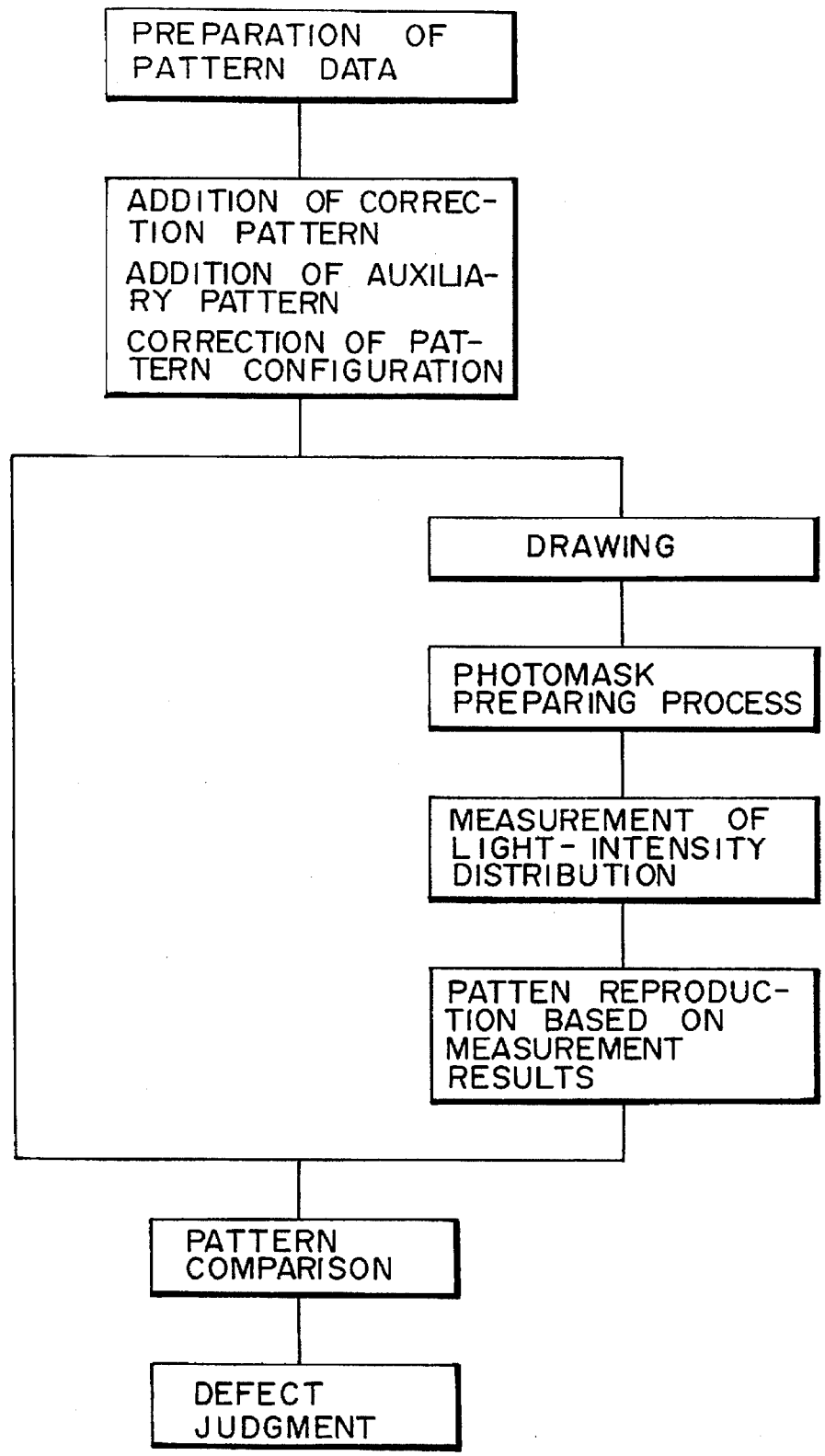
FIG. 1 is a flowchart for illustrating the operational flow of a conventional pattern defect checking process.
Figure 2:
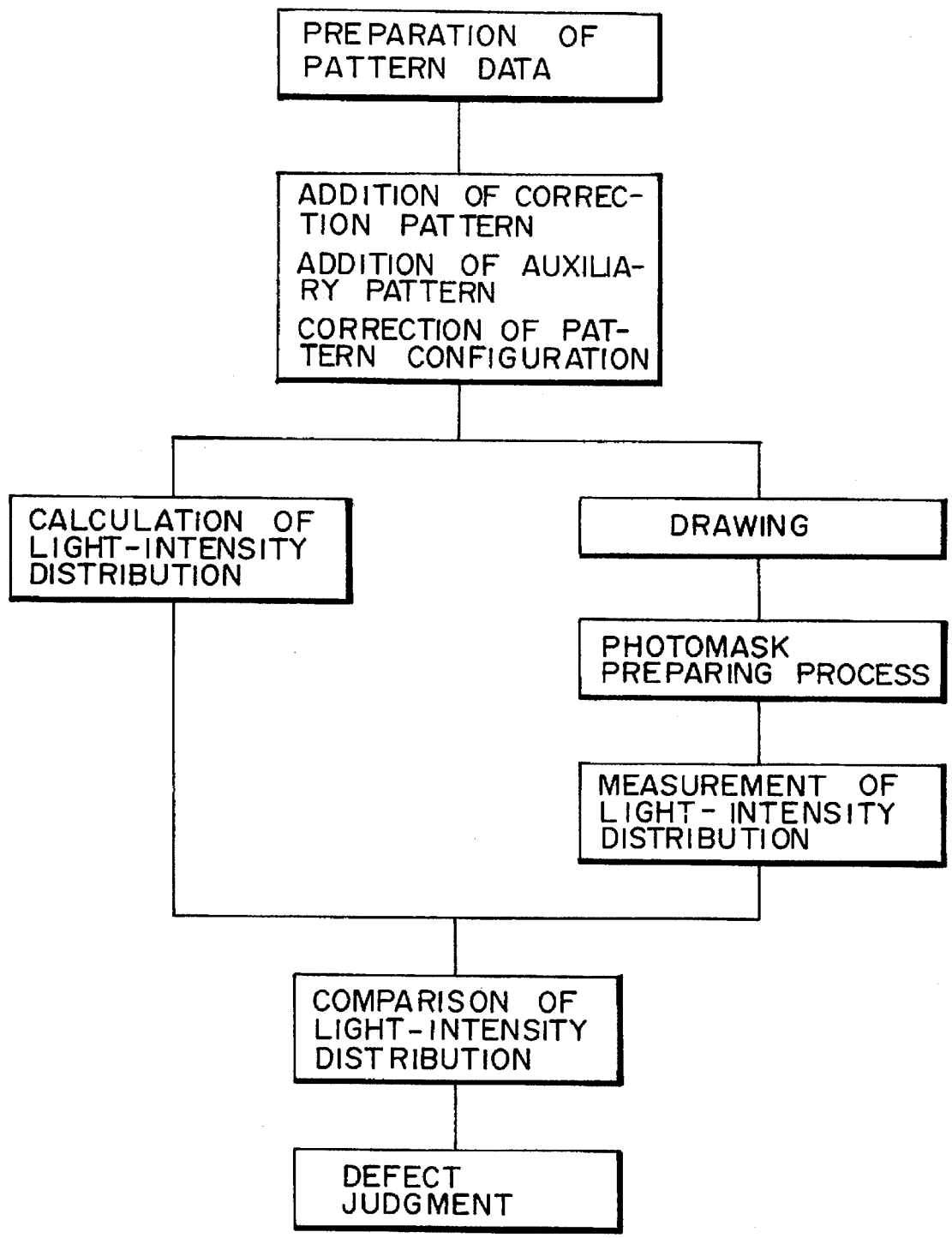
FIG. 2 is a flowchart for illustrating the operational flow of a pattern defect checking process according to the present invention.

FIG. 2 shows a flowchart for illustrating the operational flow of a pattern defect checking process according to the present invention. In the pattern defect checking method of the present invention, pattern data is prepared beforehand. The pattern data can be prepared by a well-known method. For example, a correction pattern or an auxiliary pattern for light proximity effect correction for correcting the configuration of the pattern to be transferred to the resist, an auxiliary pattern for the phase shift mask, an auxiliary pattern to be used when the configuration of the light source of the exposure device is varied, or an auxiliary pattern when a filter is inserted in the lens pupil plane of a lens, is added to the pattern as needed.

Then, light intensity distribution is calculated on the basis of the pattern data. That is, the light intensity of the entire photo mask is calculated by using this pattern data. The calculation of the light intensity of the entire photo mask is appropriately conducted by dividing the area of the pattern to be formed on the photo mask in units of 100 μm square on the wafer. When conducting the light intensity calculation, the 100 μm square area is further divided into meshes of 1024×1024. Further, 64 tone levels are assigned to the light intensity of each mesh. The light intensity distribution obtained by the calculation is stored in, for example, a memory. This pattern data is also transferred to the drawing process for actually preparing the photo mask. After the pattern drawing, the photo mask is prepared by the photo mask preparing process.

The light intensity distribution due to the light transmitted through the photo mask prepared is measured by, for example, a CCD sensor of a defect checking apparatus. The light source wavelength of the defect checking apparatus was made the same as the wavelength of the exposure light used when actually transferring the pattern to the resist, for example, the i-line of a mercury lamp (365 nm). The light intensity distribution measured was divided in the 100 µm units on the wafer, and further, the range of 100 µm square was divided into meshes of 2048×2048. Further, 64 tone levels were assigned to the light intensity of each mesh. The light intensity distribution measured is stored in a memory. The size of each of 2048×2048 meshes is 0.0488 µm. This size corresponds to the size of 0.244 µm on a five-times photo mask. However, since the size of the pattern defect actually transferred to the resist is larger than this mesh size, no problem is entailed by setting the mesh size at this level.

Next, the light intensity distribution due to the light transmitted through the photo mask (hereinafter referred to also as "measured light intensity distribution") is compared with a light intensity distribution calculated on the basis of pattern data (hereinafter referred to also as "calculated light intensity distribution") with respect to each 100 µm square area. To reduce the calculation time, the calculated light intensity distribution is set larger than the mesh size in the measured light intensity distribution. However, when the light intensity distribution comparison is conducted, interpolation is effected for adapting to the 2048×2048 mesh size. Assuming that the light intensity of each mesh in the calculated light intensity distribution is Ic, and that the light intensity of each mesh in the measured light intensity distribution is Im, the ratio of these light intensities is obtained as:

$$C=(Ic+a)/(Im+a) \qquad (1)$$

where a is a constant introduced for the purpose of preventing divergence of equation (1) when the value of Im in equation (1) becomes 0.

When there is no defect in the pattern, C has a constant value (c). When there is any defect in the pattern, C deviates from the constant value (c). Thus, the position of the pattern can be specified from the position of the mesh where the value of equation (1) differs from the constant value (c). Further, when Im<Ic, the defect is found to be one which does not allow transmission of light, and when Ic<Im, the defect is found to be one which allows transmission of light (for example, a pinhole existing in a lightproof region) or one which allows transmission of light and which differs in phase. In this way, the type of pattern defect can also be predicted.

When the values of Ic and Im are made substantially equal to each other prior to the calculation of equation (1) by using as a reference the intensity of light transmitted through a relatively large pattern of, for example, approximately 10 µm square, it is still further convenient for the execution of the calculation. Further, by differentiating the value C obtained from equation (1), it is possible to specify the size and position of the pattern defect more clearly.

A pattern of a size of 1 mm square composed of a hole pattern and a line-and-space pattern with program-arranged defects was actually formed, and further, an ordinary photo mask in which a light proximity effect correction pattern and an auxiliary pattern were added to a portion of the pattern was prepared. In the light intensity distribution calculation based on the pattern data, NA was set at 0.57, and σ was set at 0.6. Then, by using a work station of 125 MIPS, the calculation of light intensity distribution based on the pattern data was completed in approximately three hours.

In the photo mask prepared, the light intensity distribution was measured under the conditions of NA of 0.57 and σ of 0.6. Then, by the above-described method, the light intensity distribution due to the light transmitted through the photo mask was compared with the light intensity distribution calculated on the basis of the pattern data. As a result, a defect detection sensitivity of 0.2 µm was confirmed on a five-times photo mask (0.04 µm on the resist). The requisite time for the measurement of the light intensity distribution due to the light transmitted through the photo mask was five minutes and the requisite time for the comparison of the light intensity distributions was not more than one minute.

Similarly, a pattern of a size of 1 mm square composed of a hole pattern and a line-and-space pattern with program-arranged defects was actually formed, and further, a half-tone type phase shift mask in which a light proximity effect correction pattern and an auxiliary pattern were added to a portion of the pattern was prepared. The light intensity transmittance in the translucent region was determined as 4.0% using the transmittance after transmission through a quartz substrate as a reference. In the light intensity distribution calculation based on the pattern data, NA was set at 0.57, and σ was set at 0.3. Then, by using a work station of 125 MIPS, the calculation of light intensity distribution based on pattern data was completed in approximately three hours.

In the photo mask prepared, the light intensity distribution was measured under the conditions of NA of 0.57 and σ of 0.3. Then, by the above-described method, the light intensity distribution due to the light transmitted through the photo mask was compared with the light intensity distribution calculated on the basis of the pattern data. As a result, a defect detection sensitivity of 0.4 µm was confirmed on a five-times photo mask (0.08 µm on the resist). The requisite time for the measurement of the light intensity distribution due to the light transmitted through the photo mask was five minutes, and the requisite time for the comparison of the light intensity distributions was not more than one minute. The reason for the reduction in defect checking sensitivity as compared with the ordinary photo mask was due to the fact that the phase difference between the light transmitted through the translucent area and the light transmitted through the light transmitting area had been deviated from the pre-set value by approximately 5 degrees, which was confirmed after the measurement of the light intensity distribution.

While the present invention has been described with reference to a preferred embodiment, the present invention is not restricted to this embodiment. The conditions and values given in the description of the embodiment were only given by way of example, and can be changed as needed. For example, the value of the meshes, etc. shown in the embodiment is only given by way of example and can be changed as needed. Further, the pattern defect checking method of the present invention can be applied to a photo mask of any type.

In the pattern defect checking method of the present invention, pattern defect checking can be flexibly conducted on any type of pattern or photo mask structure, such as a correction pattern, an auxiliary pattern or a substrate engraving type. Further, by calculating the light intensity distribution beforehand, the requisite time for pattern defect checking can be reduced. For example, in the re-examination after the defect correction, the comparison and checking of light intensity distribution is performed only where the defect existed, thereby reducing the requisite time for defect checking. By the pattern defect checking method of the present invention, it is possible to check a pattern defect which has conventionally been impossible to check. Further, a reduction can be achieved in terms of the photo mask production cost.

What is claimed is:

1. A method of checking the mask pattern of a photo mask used to project a pattern onto a wafer, said method comprising the steps of:

preparing pattern data of a pattern formed on a photo mask;

calculating the light intensity distribution of the pattern projected onto the wafer on the basis of said pattern data;

causing exposure light to be transmitted through said photo mask to project the pattern and detecting the light intensity distribution of the pattern thus projected;

comparing the calculated light intensity distribution with the detected light intensity distribution; and checking the pattern formed on the photo mask for any defect on the basis of the result of the comparison.

2. A method of checking the mask pattern of a photo mask according to claim 1, wherein the wavelength of the light transmitted through said photo mask is the same as the wavelength of the exposure light used when projecting the pattern onto the wafer by using said photo mask.

3. A method of checking the mask pattern of a photo mask according to claim 1, wherein said photo mask is a phase shift mask.

4. A method of checking the mask pattern of a photo mask according to claim 3, wherein said photo mask is a half-tone type phase shift mask.

* * * * *